US007064428B2

(12) United States Patent
Tong et al.

(10) Patent No.: US 7,064,428 B2
(45) Date of Patent: Jun. 20, 2006

(54) WAFER-LEVEL PACKAGE STRUCTURE

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW); Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 183 days.

(21) Appl. No.: 10/248,114

(22) Filed: Dec. 19, 2002

(65) Prior Publication Data

US 2003/0160323 A1 Aug. 28, 2003

(30) Foreign Application Priority Data

Feb. 26, 2002 (TW) .............................. 91103381 A

(51) Int. Cl.
*H01L 23/10* (2006.01)
*H05K 7/20* (2006.01)

(52) U.S. Cl. ...................... 257/707; 257/713; 257/717; 257/720; 361/709; 361/712

(58) Field of Classification Search .......... 257/77–781; 438/108, 612, 613, 614
See application file for complete search history.

(56) References Cited

U.S. PATENT DOCUMENTS

| | | | | |
|---|---|---|---|---|
| 4,341,594 | A * | 7/1982 | Carlson et al. | 438/704 |
| 5,156,997 | A * | 10/1992 | Kumar et al. | 438/614 |
| 5,767,010 | A * | 6/1998 | Mis et al. | 438/614 |
| 5,904,859 | A * | 5/1999 | Degani | 216/18 |
| 6,387,795 | B1 * | 5/2002 | Shao | 438/613 |
| 6,415,974 | B1 * | 7/2002 | Jao | 228/215 |
| 6,462,426 | B1 * | 10/2002 | Kelkar et al. | 257/781 |
| 6,709,898 | B1 * | 3/2004 | Ma et al. | 438/122 |
| 6,841,413 | B1 * | 1/2005 | Liu et al. | 438/106 |

OTHER PUBLICATIONS

U.S. Appl. No. 60/318,271.*

* cited by examiner

*Primary Examiner*—Alonzo Chambliss
(74) *Attorney, Agent, or Firm*—Jianq Chyun IP Office

(57) ABSTRACT

A wafer-level package structure, applicable to a flip-chip arrangement on a carrier, which comprises a plurality of contact points, is described. This wafer-level package structure is mainly formed with a chip and a conductive layer. The conductive layer is arranged on the bonding pads of the chip as contact points. The conductive layer can further be arranged at a region outside the bonding pads on the chip as a heat sink to enhance the heat dissipation ability of the package.

6 Claims, 6 Drawing Sheets

314 308 312 II II 308 314 310 312 306 310 304 300 302

WAFER-LEVEL PACKAGE STRUCTURE

CROSS REFERENCE TO RELATED APPLICATIONS

This application claims the priority benefit of Taiwan application serial no. 91103381, filed on Feb. 26, 2002.

BACKGROUND OF INVENTION

1. Field of Invention

The present invention relates to a wafer-level package structure. More particularly, the present invention relates to a wafer-level package structure that can replace the bump chip carrier (BCC) and the quad flat nonleaded (QFN) type of wafer-level package structure.

2. Description of Related Art

In today's information age, the market for multi-media applications is rapidly expanding. The packaging technique for integrated circuits thereby needs to be improved in accordance to the developing trends of electronic devices, such as, digitization, networking, local networking and user friendliness. In order to accommodate the above demands, electronic devices must maintain high operating speed and must be multifunctional, highly integrated, light weight and low cost. Therefore, the packaging technique for integrated circuits must also developed along the direction of further miniaturization and higher integration. Generally speaking, packaging products can be divided into the pin through hole (PTH) type and the surface mount device (SMD). The pin through hole type of packaging basically comprises pins of the device inserting into holes of the circuit board for electrical connection. The pin through hole type of packaging product is the best representative for the dual in-line package (DUP). The surface mount device, however, is directly arranged on a carrier. The contact point of the carrier and the lead of the package are electrically connected through a tin paste. As a result, the package can be easily fixed to the carrier.

Referring to FIGS. 1A and 1B, FIGS. 1A and 1B are schematic diagrams illustrating the cross-sectional views of a conventional bump chip carrier package structure. As shown in FIG. 1A, a conventional bump chip carrier package structure comprises a chip 100, a thermal conductive adhesive 104, a plurality of bonding wires 106, a plurality of terminals 108 and an encapsulant 110. The chip 100 comprises a plurality of bonding pads 102, and the chip 100 is configured on the thermal conductive adhesive 104. The bonding pads 102 on the chip 100 are electrically connected to the terminals 108 through the bonding wires 106. The encapsulant 110 is used to encapsulate the chip 100 and the bonding wires 106. Further, the thermal conductive adhesive 104 is exposed by the encapsulant 110 to enhance thermal dissipation. The terminals 108 are also exposed to the outside of the encapsulant 110 such that the chip 100 can be electrically connected to other carrier.

Referring to FIG. 1B, another type of bump chip carrier package is formed with a chip 100, a thermal conductive adhesive 104, a heat sink 114, a plurality of bonding wires 106 and 112, a plurality of terminals 108 and an encapsulant 110. The chip comprises a plurality of bonding pads 102. Further, the chip 100 is configured on the heat sink 114 with the thermal conductive adhesive 104. The bonding pads 102 on the chip 100 are electrically connected to the terminals 108 through the bonding wires 106. The bonding pads 102 are also electrically connected to the heat sink 114 through the bonding wires 112. The encapsulant 110 is used to encapsulate the chip 100, the thermal conductive adhesive 104 and the bonding wires 106 & 112. Further, the heat sink 114 is exposed to the outside of the encapsulant 110 in order for the chip 100 to electrically connected to other carriers through the terminals 108.

Referring to FIG. 2, FIG. 2 is a schematic diagram illustrating a cross-sectional view of a conventional quad flat nonleaded package structure. The quad flat nonleaded package structure is a leadframe based CSP (Chip Scale Package) constructed on a lead frame. The quad flat nonleaded package is constructed on a lead frame, wherein the lead frame comprises a die pad 214 and a plurality of leads 208. The chip 200 is configured on the die pad 214 with a thermal conductive adhesive 204. The chip 200 comprises a plurality of bonding pads 202 thereon, wherein the bonding pads 202 are electrically connected to the leads 208 through the bonding wires 206. The bonding pads 202 can also be electrically connected to the die pad 214 through the bonding wires 212. The encapsulant 210 is used to encapsulate the chip 200, the thermal conductive adhesive 204 and the bonding wires 206, 212. Further, the die pad 214 is exposed to the outside of the encapsulant 210 to enhance the thermal dissipation of the package. The leads 208 are also exposed to the outside of the encapsulant 210 to allow the chip 200 to electrically connected with other carrier.

In a conventional BCC, chemical etching must be relied upon to expose the terminals, which greatly complicates the manufacturing process.

According to the prior art, wire bonding and molding must be performed regardless the packaging is a BCC type or a QFN type of structure. Therefore, the entire packaging process would become complicated.

Further, in the conventional BCC package or the QFN package, both bonding wires and encapsulant would affect the size and the weight of the entire package.

SUMMARY OF INVENTION

Accordingly, the present invention provides a small-sized, light-weighted and easy manufactured wafer-level package structure. Further, the wafer-level package structure of the present invention is compatible with the BCC package or the QFN package.

Accordingly, a wafer-level package structure is provided, which is applicable to a flip-chip arrangement on a carrier with multiple contact points (for example, a printed circuit board). The wafer-level package structure comprises mainly a chip and a conductive layer, wherein the chip comprises a plurality of bonding pads and a protective layer. The protective layer is used to protect the chip surface and to expose the surface of the bonding pad. The conductive layer is configured on the chip. The conductive layer is configured on, for example, the bonding pad, and is used as a contact point for bonding with a carrier. Further, a heat sink is configured at a region outside the bonding pads on the chip to increase the thermal dissipation capability of the package.

The chip used in wafer-level package of the present invention is, for example, a chip in which a re-distribution of bonding pads is already accomplished. The chip comprises a wiring and a dielectric layer. The aforementioned dielectric layer is disposed on the protective layer of the chip, wherein the dielectric layer comprises a plurality of openings. The wiring is distributed between the protective layer and the dielectric layer to fan out the bonding pads to appropriate locations, while the openings expose the wiring that is used to fan out the bond pads.

In accordance to the wafer-level package, wherein the bonding pads on the chip are, for example, peripherally distributed on the chip, while the heat sink is mounted, for example, inside the region enclosed by the bonding pads.

In the wafer-level package of the present invention, the material used to form the bonding pad on the chip includes, for example, copper, aluminum type of material. The material used to form the conductive layer (including the heat sink) includes, for example, aluminum/titanium tungsten alloy/nickel vanadin alloy/copper, chromium/nickel vanadin alloy/copper, aluminum/nickel vanadin alloy/copper and titanium/nickel vanadin alloy/copper type of material.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

First Aspect

Figure 1A:
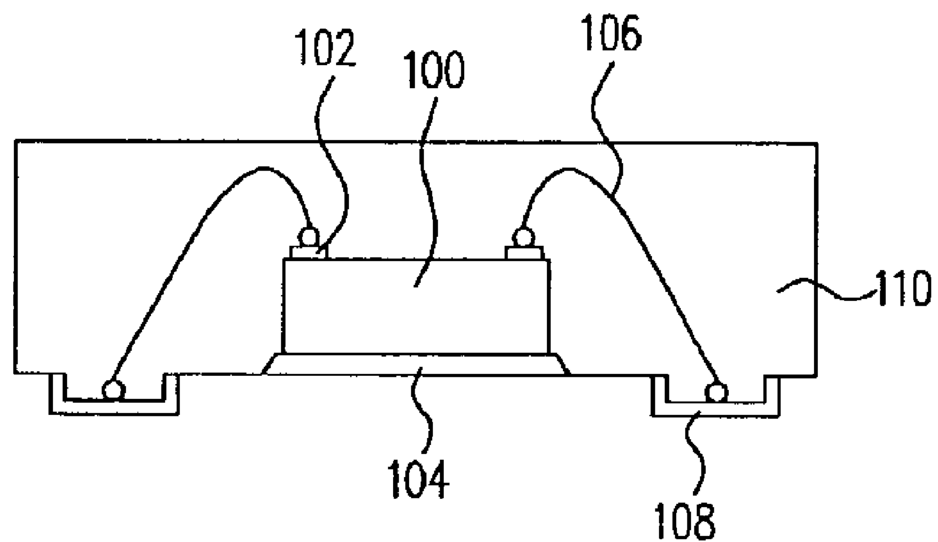
FIGS. 1A to 1B are schematic diagrams illustrating the cross-sectional views of a conventional bump chip carrier package.
Figure 1B:
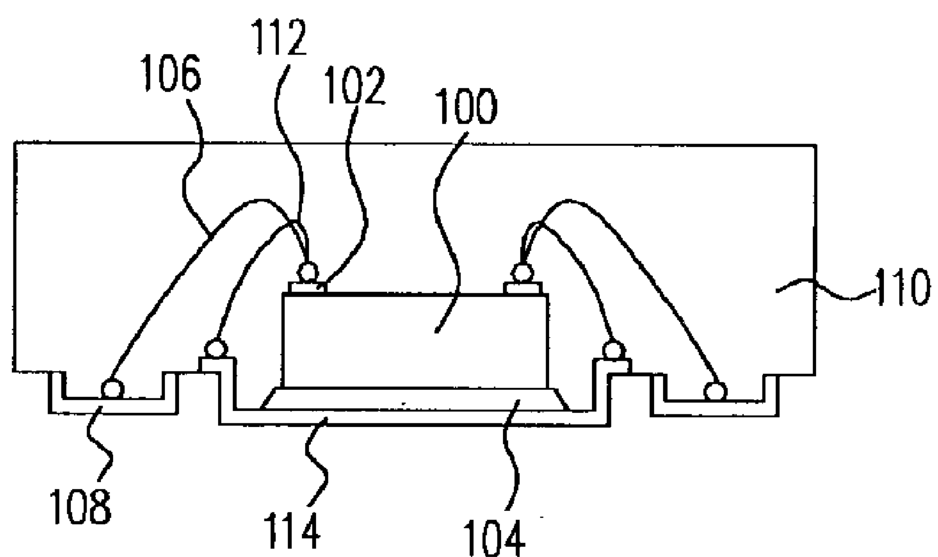
Figure 2:
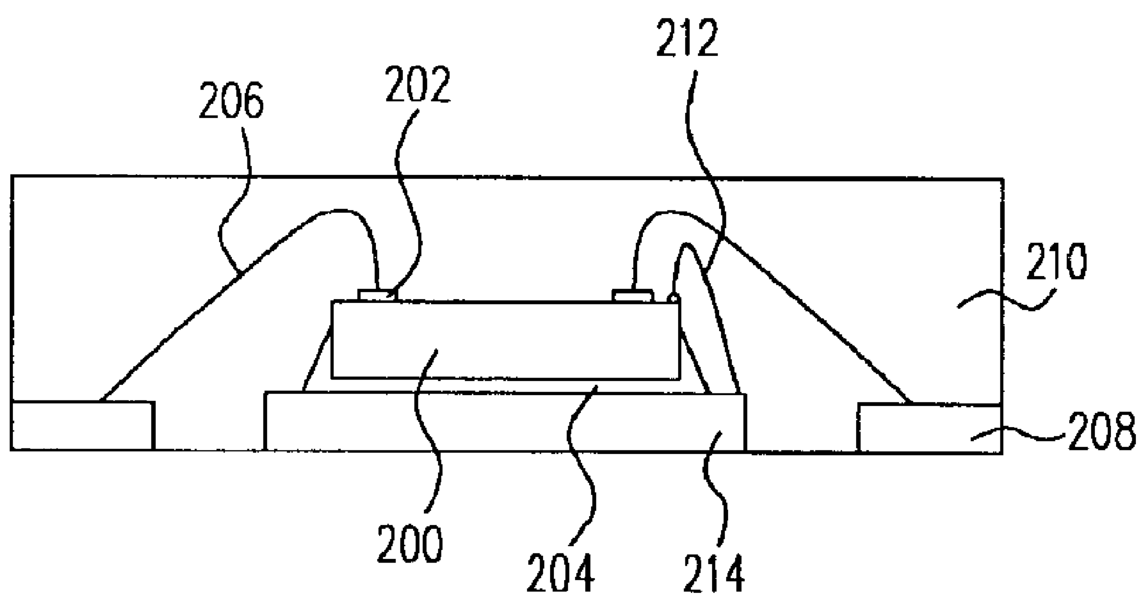
FIG. 2 is a schematic diagram illustrating the cross-sectional view of a conventional quad flat nonleaded package.
Figure 3:
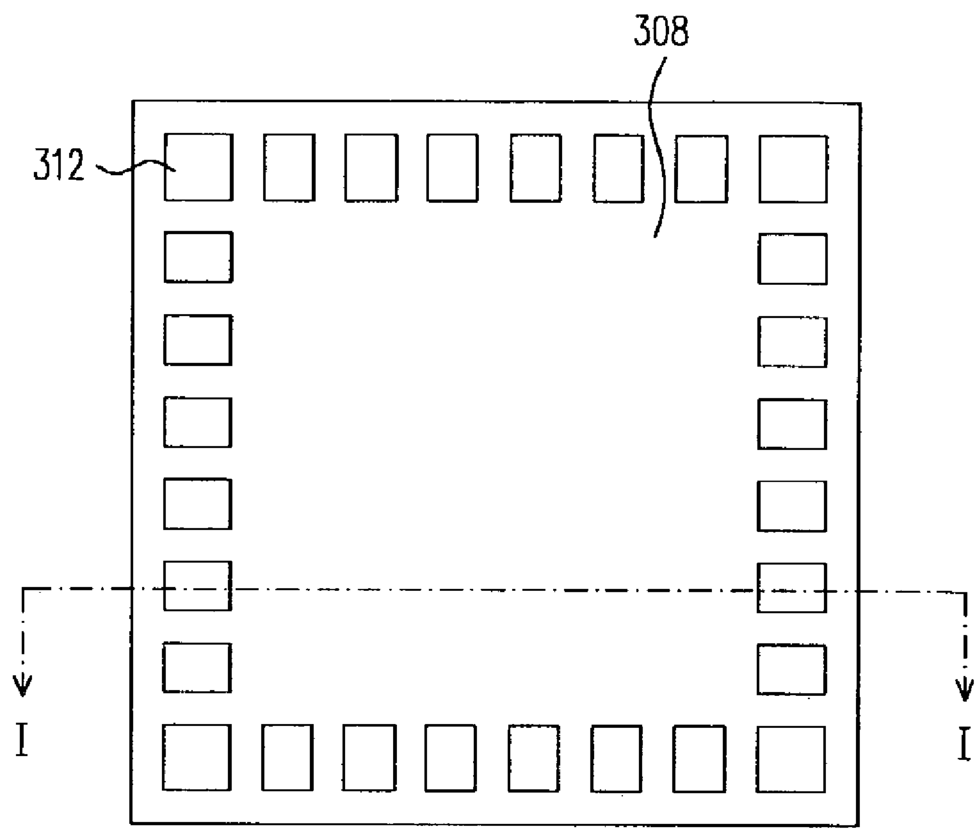
FIG. 3 is a top view of a structure of a wafer-level package without a heat sink according to a first aspect of the present invention.
Figure 4:
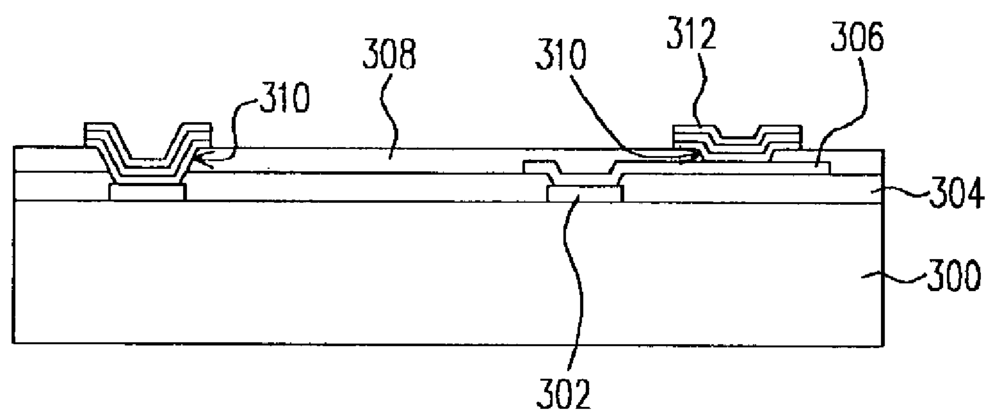
FIG. 4 is a cross-sectional view of the structure in FIG. 3 along the cutting line I—I.

Referring to both FIG. 3 and FIG. 4, FIG. 3 is a top view of a structure of a wafer-level package without a heat sink according to the first aspect of the present invention, while FIG. 4 is a cross-sectional view of the structure in FIG. 3 along the cutting line I—I. The chip 300 comprises a plurality of bonding pads 302 and a protective layer 304. The protective layer 304 covers the chip 300 and exposes the bonding pads 302. The bonding pads 302 are formed with a material such as, copper or aluminum, etc., while the protective layer 304 is formed with, for example, a silicon oxide ($SiO_x$) material or a silicon nitride ($SiN_x$) material.

The chip 300 further comprises a wiring 306 and a dielectric layer 308 distributed thereon, wherein the dielectric layer 308, for example, comprises a plurality of openings 310 therein. For example, the openings 310 are distributed peripherally in the dielectric layer 308 on the chip 300. Moreover, the openings 310 expose the wiring 306 underneath the dielectric layer 308. The wiring 306 is distributed, for example, above parts of the bonding pads 302 and the protective layer 304, and uses the bonding pads 302 to fan-out to appropriate locations. The aforementioned dielectric layer 308 includes, for example, polyimide or benzene cyclobutene (BCB), etc., while the circuit line 306 is formed with, for example, copper.

Moreover, a conductive layer 312 is configured on the wiring 306 exposed by the opening 310 in the dielectric layer 308, wherein the conductive layer 312 is used as a contact point for the chip 300 with other carrier. The conductive layer 312 includes, for example, aluminum/titanium tungsten alloy/nickel vanadin alloy/copper, chromium/nickel vanadin alloy/copper, aluminum/nickel vanadin alloy/copper and titanium/nickel vanadin alloy/copper type of material.

As shown in FIG. 3, since the openings 310 are peripherally distributed in the dielectric layer 308 on the chip 300, the conductive layer 312 exposed on the surface of the chip 300 is also peripherally distributed. Therefore, for those skilled in the art, it is understood that the opening 310 in the dielectric layer 308 and the conductive layer 312 can be gathered in the center, distributed in a grid array arrangement or other type of arrangement.

Figure 5:
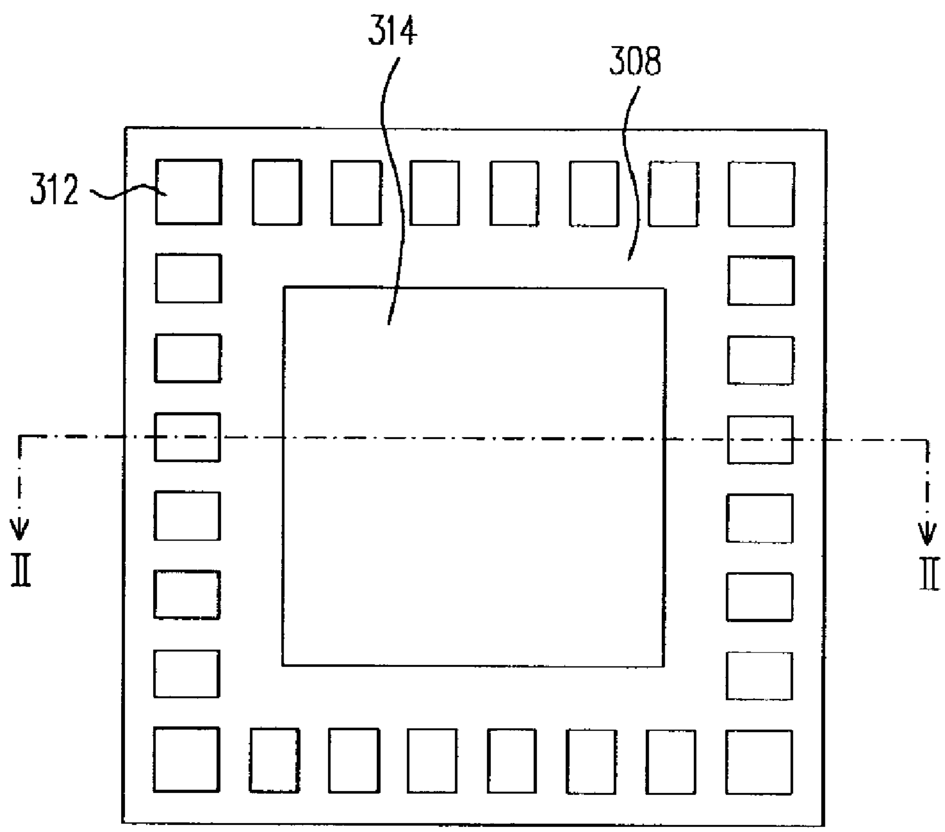
FIG. 5 is a top view of a structure of a wafer-level package with a heat sink according to the first aspect of the present invention.
Figure 6:
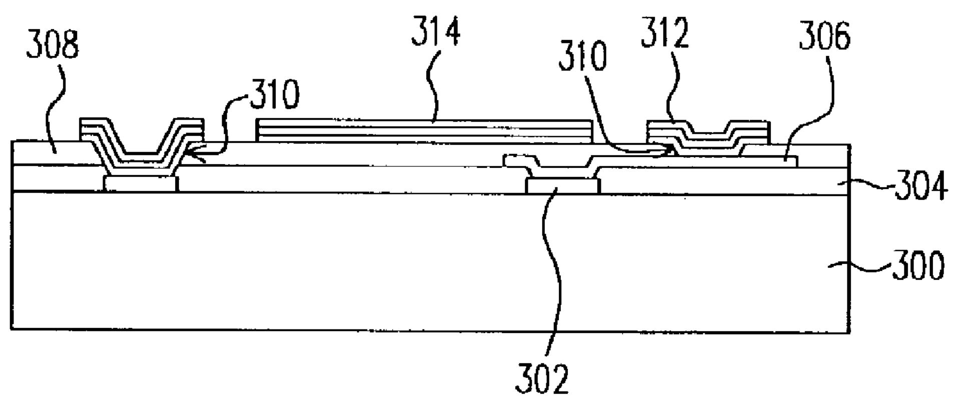
FIG. 6 a cross-sectional view of the structure in FIG. 5 along the cutting line II—II.

Referring to both FIG. 5 and FIG. 6, FIG. 5 is a top view of a structure of a wafer-level package with a heat sink according to the first aspect of the present invention, while FIG. 6 is a cross-sectional view of the structure in FIG. 5 along the cutting line II—II. The difference between the structures in FIGS. 5 & 6 and in FIGS. 3 & 4 is the arrangement of a heat sink.

According to the structure of the wafer-level package in FIGS. 5 and 6, the openings are peripherally distributed in the dielectric layer 308 on the chip 300. Further, the conductive layer 312 is also peripherally distributed. With the openings 310 and the conductive layer 312 being peripherally distributed, the heat sink 314 above the dielectric layer 308 is configured in the region enclosed by the conductive layer 312 to further increase the heat dissipation capability.

Second Aspect

Figure 7:
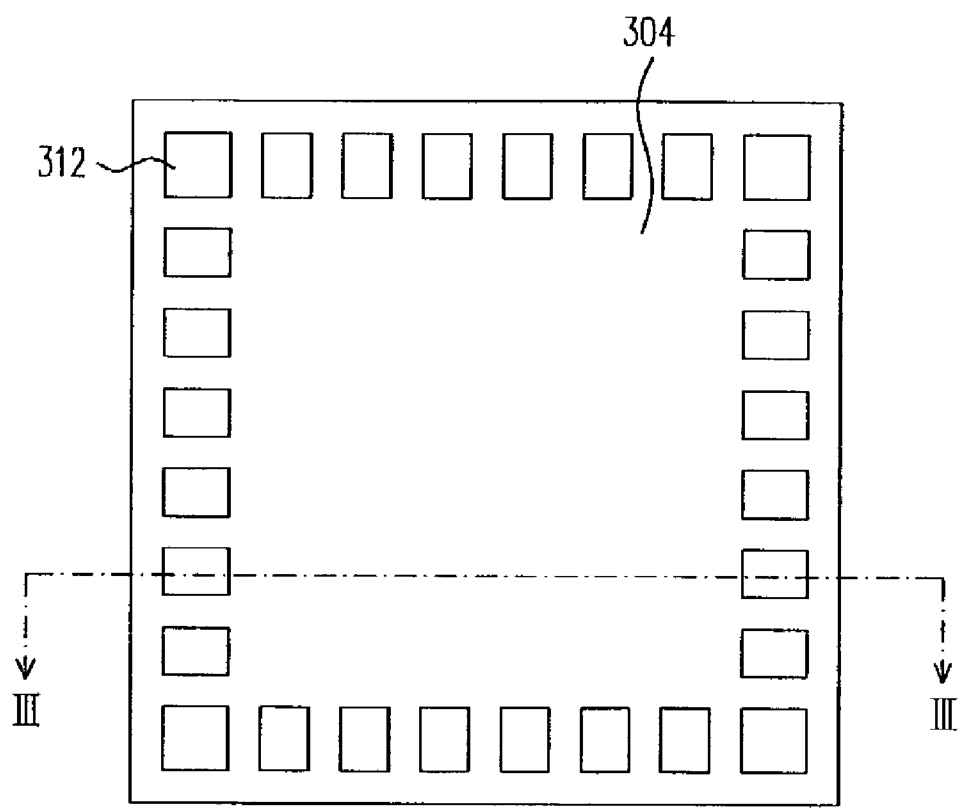
FIG. 7 is a top view of a structure of a wafer-level package without a heat sink according to a second aspect of the present invention.
Figure 8:
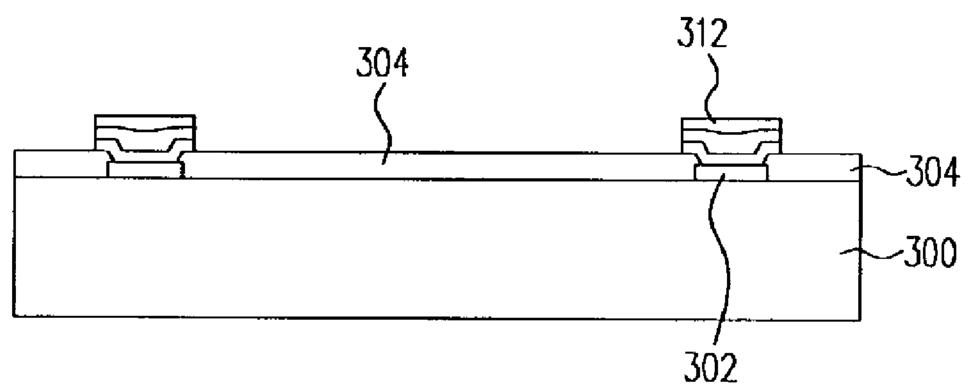
FIG. 8 is a cross-sectional view of the structure in FIG. 7 along the cutting line III—III.

Referring to both FIGS. 7 and 8, FIG. 7 is a top view of a structure of a wafer-level package without a heat sink according to the second aspect of the present invention, while FIG. 8 is a cross-sectional view of a structure in FIG. 7 along the cutting line III—III. The chip 300 comprises a plurality of bonding pads 302 and a protective layer 304. The protective layer 304 covers the chip 300 and exposes the bonding pads 302, wherein the bonding pads 302 are peripherally distributed on the chip 300. The bonding pads 302 are, for example, copper or aluminum. The protective layer 304 is formed with, for example, silicon oxide ($SiO_x$) or silicon nitride ($SiN_x$) type of material.

Further, a conductive layer 312 is configured on the bonding pads 302 exposed on the surface of the chip 300. This conductive layer 312 is served as a contact point for the chip 300 with other carrier. The conductive layer 312 includes aluminum/titanium tungsten alloy/nickel vanadin alloy/copper, chromium/nickel vanadin alloy/copper, aluminum/nickel vanadin alloy/copper and titanium/nickel vanadin alloy/copper type of material.

As shown in FIG. 8, the bonding pads 302 are, for example, peripherally distributed on the chip 300. Therefore, the conductive layer 312 exposed on the surface of the chip 300 is also peripherally distributed. However, for those skilled in the art, it is understood that the bonding pad 302 and the conductive layer 312 can also be distributed in the center, in a grid array arrangement or other type of arrangement.

Figure 9:
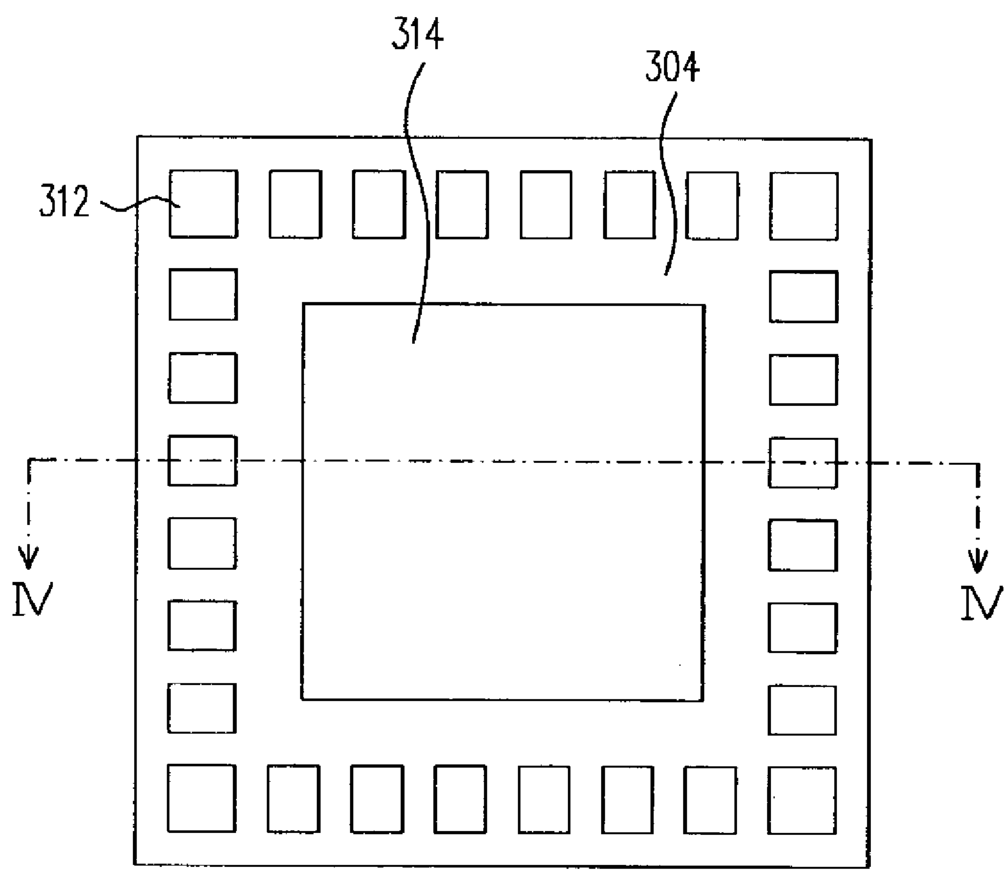
FIG. 9 is a top view of a structure of a wafer-level package with a heat sink according to the second aspect of the present invention.
Figure 10:
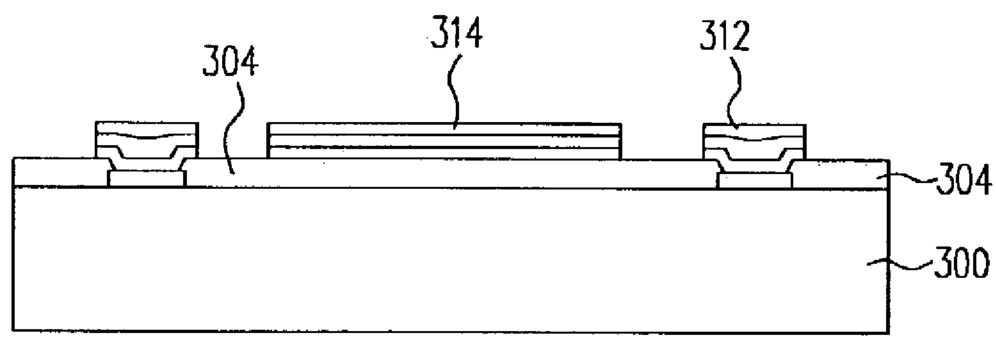
FIG. 10 is a cross-section view of the structure in FIG. 9, along the cutting line IV—IV.

Referring to both FIG. 9 and FIG. 10, FIG. 9 is a top view of a structure of a wafer-level package with a heat sink according to the second aspect of the present invention, while FIG. 10 is a cross-section view of the structure in FIG. 9, along the cutting line IV—IV. The wafer-level structure in FIGS. 9 and 10 is similar to that in FIGS. 7 and 8. The only difference is the presence of a heat sink 314.

According to the wafer-level structure shown in FIGS. 9 & 10, the bonding pads 302, for example, are peripherally distributed on the chip 300, wherein the conductive layer 312 thereabove is also peripherally distributed. Because the bonding pads 302 or the conductive layer 312 is peripherally distributed, the heat sink 314 above the protective layer 304 is arranged inside the region enclosed by the bonding pads 302 and the conductive layer 312 to further enhance the thermal dissipation capability.

Accordingly, the wafer-level package structure of the present invention does not require any lead frame. Therefore, the manufacturing process is simpler and more cost effective.

Additionally, the wafer-level package structure of the present invention is less heavy compared to the BCC package or the QFN package.

In accordance to the wafer-level package structure of the present invention, the bonding pads on the chip are connected to the contact point on the carrier directly with the conductive layer. The signal transmission speed is thereby enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A wafer-level package structure, which is applicable to a flip-chip arrangement on a carrier, the carrier comprising a plurality of contact points and the wafer-level package structure comprising at least:

a chip, wherein the chip comprises a plurality of bonding pads and a protective layer, wherein the protective layer protects the chip and exposes surfaces of the banding pads through openings in the protective layer;

a heat sink formed on the protective layer, wherein the heat sink is disposed inside a region enclosed by the bonding pads; and a conductive layer, wherein the conductive layer is formed on the bonding pads, covering the exposed surfaces of the bonding pads and covering only a portion of the protective layer surrounding the openings.

2. The structure of claim 1, wherein the bonding pads are formed at a periphery of the chip.

3. The structure of claim 1, wherein the bonding pads are formed with a material selected from the group consisting of copper and aluminum.

4. The structure of claim 1, wherein the conductive layer is formed with a material selected from the group consisting of aluminum/titanium tungsten alloy/nickel vanadin alloy/copper, chromium/nickel vanadin alloy/copper, aluminum/nickel vanadin alloy/copper and titanium/nickel vanadin alloy/copper.

5. The structure of claim 1, wherein the heat sink is formed with a material selected from the group consisting of aluminum/titanium tungsten alloy/nickel vanadin alloy/copper, chromium/nickel vanadin alloy/copper, aluminum/nickel vanadin alloy/copper and titanium/nickel vanadin alloy/copper.

6. The structure of claim 1, wherein the carrier includes a printed circuit board.

* * * * *